439-68 AU 322 ... EA
13040 OR RE 32,370

United States Patent [19]
Bright et al.

[11] E Patent Number: Re. 32,370
[45] Reissued Date of Patent: Mar. 10, 1987

[54] LOW HEIGHT ADS CONNECTOR

[75] Inventors: Edward J. Bright, Elizabethtown; Steven J. Kandybowski, Tower City, both of Pa.

[73] Assignee: AMP Incorporated, Harrisburg, Pa.

[21] Appl. No.: 821,649

[22] Filed: Jan. 23, 1986

Related U.S. Patent Documents

Reissue of:
[64] Patent No.: 4,427,249
Issued: Jan. 24, 1984
Appl. No.: 412,680
Filed: Aug. 30, 1982

U.S. Applications:
[63] Continuation of Ser. No. 230,202, Feb. 2, 1981, abandoned.

[51] Int. Cl.[4] ..... H01R 23/68
[52] U.S. Cl. ..... 339/17 CF; 339/75 MP; 339/176 MP
[58] Field of Search ..... 339/17 CF, 75 M, 75 MP, 339/176 MP

[56] References Cited

U.S. PATENT DOCUMENTS

| | | | |
|---|---|---|---|
| 3,660,803 | 5/1972 | Cooney | 339/17 LM |
| 3,831,131 | 8/1974 | Woodcock et al. | 339/17 CF |
| 3,940,786 | 2/1976 | Scheingold et al. | 339/17 CF |
| 3,951,495 | 4/1976 | Donaher et al. | 339/17 CF |
| 4,130,327 | 12/1978 | Spaulding | 339/17 CF |
| 4,166,665 | 9/1979 | Cutchaw | 339/17 CF |
| 4,220,383 | 9/1980 | Scheingold et al. | 339/17 CF |
| 4,331,373 | 5/1982 | Demnianiuk | 339/17 CF |
| 4,340,266 | 7/1982 | Grovender | 339/17 CF |
| 4,341,433 | 7/1982 | Cherian et al. | 339/176 MP |
| 4,351,580 | 9/1982 | Kirkman et al. | 339/75 MP |

*Primary Examiner*—John McQuade
*Attorney, Agent, or Firm*—Allan B. Osborne

[57] ABSTRACT

The present invention relates to a connector for mechanically retaining and electrically connecting an ADS (active device substrate) to a PCB (printed circuit board). More particularly, the invention comprises an insulating housing in which a number of contact elements are positioned. These contact elements have means on one end for contacting traces on the PCB and contact surfaces on another end for contact with the pads on the ADS. A cover provides means for retaining the ADS in the housing and for biasing it against the contact surfaces.

6 Claims, 4 Drawing Figures

LOW HEIGHT ADS CONNECTOR

Matter enclosed in heavy brackets [ ] appears in the original patent but forms no part of this reissue specification; matter printed in italics indicates the additions made by reissue.

This is a continuation of application Ser. No. 230,202, filed Feb. 2, 1981, now abandoned.

BACKGROUND OF THE INVENTION

1. The Field of the Invention

The invention relates to connectors for electrically connecting integrated circuit packages, known also as active device substrates (ADS), to printed circuit boards. The housings of the connectors in this particular area of the art are secured to the board permanently, relatively speaking. Accordingly, means are associated with the housings to removably retain the ADS therein.

2. The Prior Art

The active device substrates of interest herein are of the type having integrated circuit semiconductors, i.e., "chips", mounted on a ceramic substrate. Thin, conductive traces or pads radiate from the chip outwardly to the substrates four sides. The substrates are relatively fragile which presents a problem; i.e., means to bias the substrate against the contact elements with sufficient force to maintain good electrical contact without breakage. Clearly, the force must be applied uniformly to the substrate. Representative prior art patents meeting the aforementioned requirement include U.S. Pat. Nos. 4,130,327 and 4,220,383. Both patents disclose connectors having contact elements in an insulative housing into which an ADS is received. Contact surfaces on the upper ends of the elements engages the pads on the substrate. Leads or pins on the lower end of the elements in U.S. Pat. No. 4,130,327 are adapted for insertion into holes in a PCB. The lower ends of the elements in U.S. Pat. No. 4,220,383 are adapted for abutting engagement against traces on the board; i.e., a "surface to surface" connection. Both patents includes covers which bias the substrate against the aforementioned contact surfaces.

Further, both patents disclose contact elements which possess spring characteristics such that they can tolerate the downward deflection imposed on them by the cover without taking a set.

SUMMARY OF THE INVENTION

The current trend by PCB users is to stack the boards one on top of the other with the boards on about 12.7 mm (one-half inch) centers. This usage obsoletes connectors such as disclosed in the above prior art patents. The usage also provided a problem to workers in the field; i.e., designing a connector having a low height but containing contact elements which, even though subject to high deflection, retain their resiliency so as to maximize the electrical contact between the pads on the substrate and the contact surfaces on the contact elements.

Accordingly, the present invention discloses a low height connector having a housing of insulating material, contact elements having elongated, U-shaped spring sections to provide high resiliency, and a resilient cover adapted to bias an ADS against surfaces on the elements.

DESCRIPTION OF THE INVENTION

Figure 1:
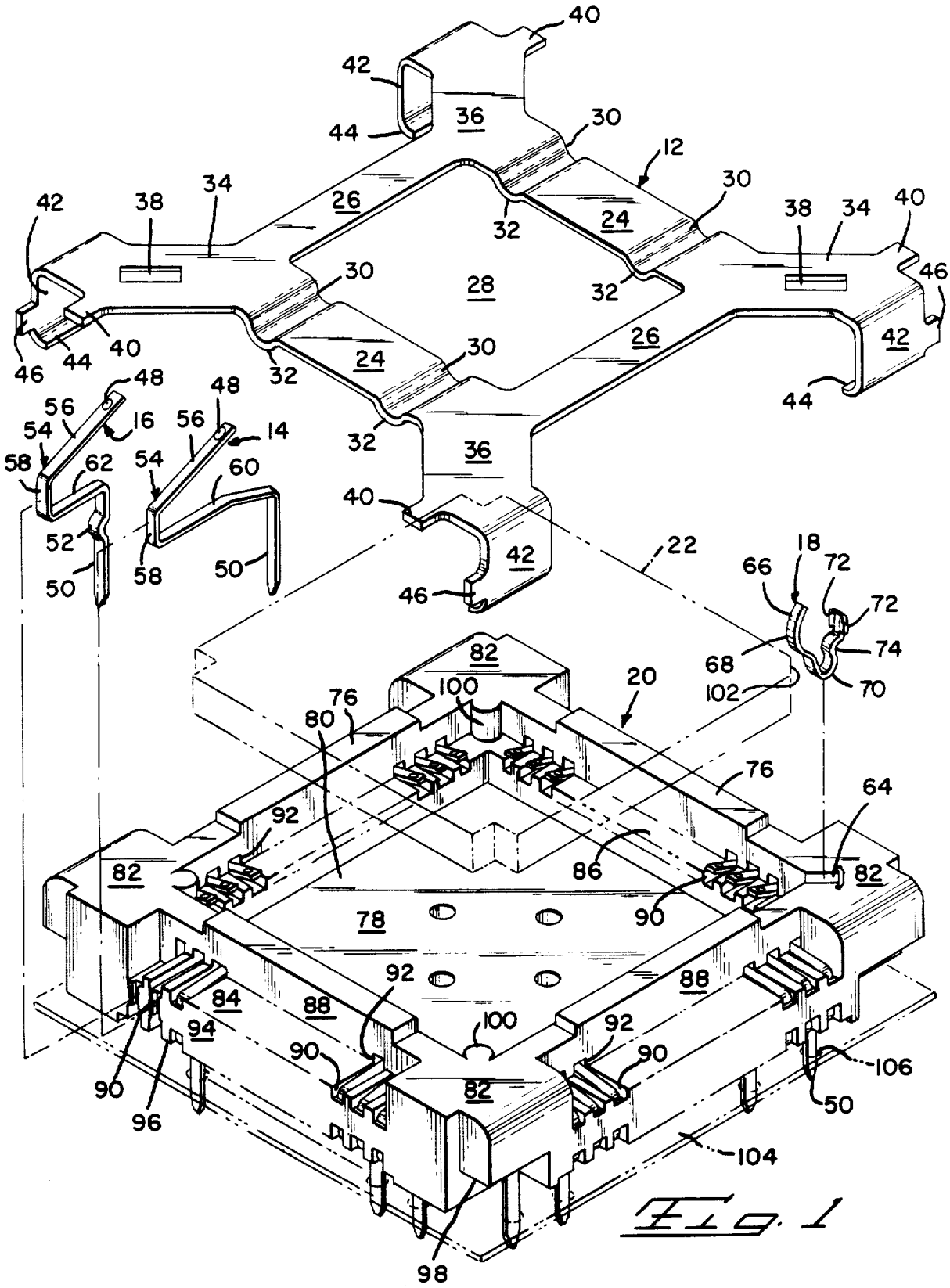
FIG. 1 is an exploded, perspective view of the connector constructed in accordance with the concepts of the present invention.
Figure 2:
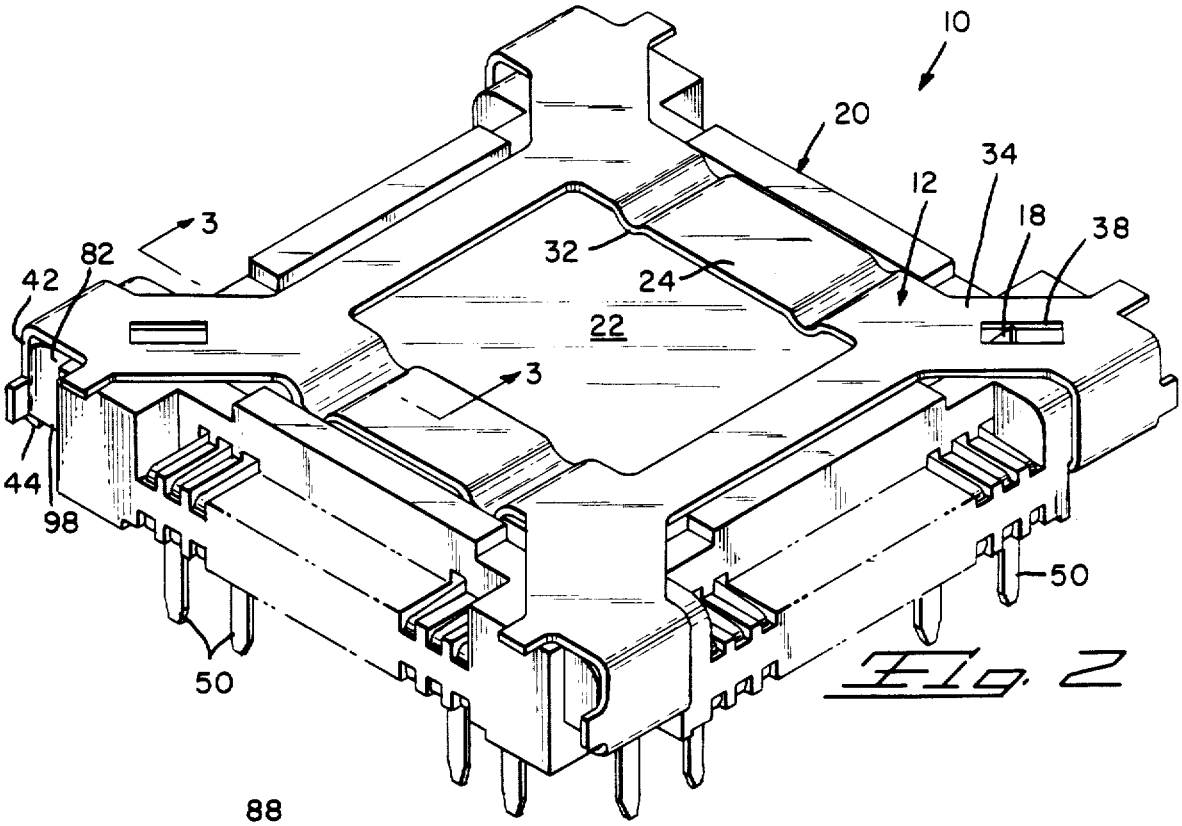
FIG. 2 is a perspective view of the connector of FIG. 1 assembled.

FIG. 1 illustrates the five components of connector 10 shown assembled in FIG. 2. These components are, from top to bottom, cover 12, first contact element 14, second contact element 16, thrust clip 18 and housing 20. A ceramic active device substrate (ADS) 22 is shown in phantom.

Cover 12 is made from a spring material such as steel and heat treated. A nickel over copper plating may be provided if desired.

The cover is made in the shape of a frame having sides 24 and 26 which define a central opening 28. Two downwardly projecting dimples 30 are formed on each side 24 to provide convex surfaces 32 on the undersurfaces thereof.

Arms 34 and 36 extend outwardly from each corner of the frame with the direction of extension being oblique. A notch 38 is provided in each arm 34 and a first tab 40 is provided on all four arms. These tabs project outwardly.

Latch 42 is attached to the free end of each arm and extends downwardly therefrom. The latch includes a vertical member and an inwardly projecting lip 44 at its free end. A second tab 46 attached to the vertical member. Tabs 46 extend outwardly in the same direction as first tabs 40.

First and second contact elements 14 and 16 respectively each have a contact surface 48 and a depending pin 50. One or both pins may have a jog 52 (shown only on the pin of second element 16). The contact surface 48 may be flat or, preferably is raised as shown clearly in FIG. 3. Other contact surfaces may be employed also; e.g., a U-shaped bend.

C-shaped section 54 joins contact surface 48 and pin 50.

With respect to both contact elements, the upper limb 56 of section 54 constitutes a cantilever beam and as such provides a spring force to contact surface 48 positioned on the free end of the beam. Supporting the beam is the vertical connecting strap 58.

The lower limb 60 of element 14 and 62 of element 16 supports the elements in housing 20. Lower limb 60 is longer so that pin 50 extends further inwardly (relative to the pin on element 16 when both are in the housing) and is also bent so that the pin is displaced. Thus, with an element 14 positioned next to an element 16 in the housing, pin 50 on the former is directly in line with pin 50 on the latter. This arrangement increases the distance between termination points on the PCB such as from 0.050 centers on line to a 0.100 grid. This permits routing of the board's traces between the termination holes.

The contact elements are preferably stamped and formed from beryllium copper, heat treated and plated with gold over nickel or tin lead over nickel.

Thrust clip 18 is U-shaped and made from the same material as cover 12. The clip fits freely into slot 64 in housing 20 with one leg 66 extending into the ADS-receiving compartment. This leg has a concave-convex section 68 which bears against a corner of the ADS to orientate the ADS in the compartment. Second leg 70 has a pair of laterally extending ears 72 at its upper end. These ears are forced into the plastic defining slot 64 to retain the clip in the housing. Leg 70 also has a concave-convex section 74 to give the clip greater spring force.

Housing 20 is preferably molded, using a plastic material sold under the tradename "RYTON R-4" by the Phillips Chemical Company. The square housing includes four side walls 76 and a floor 78 which combine to define a central, ADS-receiving compartment 80. Each side wall terminates in a corner block 82.

Side walls 76 include a step on the outer surface to provide an upwardly facing ledge 84. A similar ledge 86, extending along the inside surface, is on the same elevation. The vertical wall section 88 of the side walls rise up to define the aforementioned compartment 80. Grooves 90 cut across the ledges with openings 92 through walls 88 connecting the two. Further, the grooves extend down the outwardly facing surface 94 of the side wall and inwardly on the base surface 96 of the housing. Subsequent to loading the contact elements 14 and 16 into the housing, the grooves on surfaces 94 are closed by flowing plastic across them.

The corner blocks 82 have a downwardly facing shoulder 98 on an outside surface. The shoulders, in cooperation with latches 42 on cover 12 provide a means for removably fastening the cover to the housing.

Cylindrical structures 100 on the inside corner of three corner blocks provide orientation means relative to ADS 22. The substrate has cutouts on three corners which cooperate with the cylindrical structures so that it can be placed into compartment 80 in one position only. The fourth corner of the substrate, indicated by reference numeral 102, is angled so that concave-convex surface 68 on thrust clip 18 has a flat surface to bear against.

FIG. 1 further shows, in phantom, a locating strip 104 with pins 50 on contact elements 14–16 in holes 106 in the strip. Strip 104 holds pins 50 in alignment for insertion into a printed circuit board. The strip is preferably made from a clear insulating plastic.

FIG. 2 shows an assembled connector 10 with ADS 22 positioned therein. The cover 12 is latched to housing 20 by pressing lips 44 on latches 42 in under downwardly facing shoulders 98 on corners 82. The cover has been placed so that notch 38 on arm 34 provides space for movement of leg 66 on thrust clip 18.

Pressure is being evenly exerted against ADS 22 by the cover through convex surfaces 32 on frame sides 24.

Figure 3:
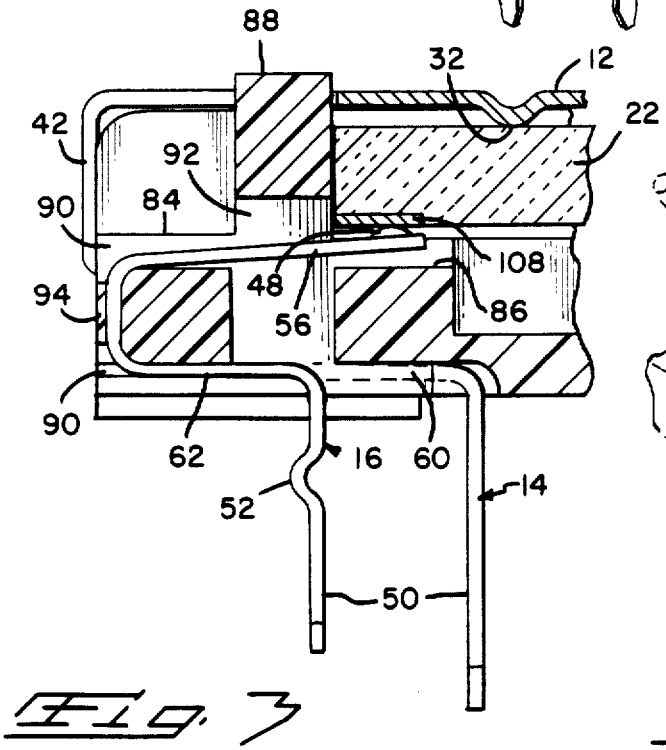
FIG. 3 is a cross-sectional view taken along line 3—3 in FIG. 2.

FIG. 3 is a cross-sectional view so as to illustrate the positioning of contact elements 14 and 16 in housing 20 and further, the relation between contact elements 48 and ADS 22.

The contact elements are loaded into grooves 90 from the sides. Elements 14 alternate with elements 16 so that there are two pins 50 in a line. As noted above, the jog or displacement of limb 60 on element 14 permits this arrangement.

After all the contact elements are in place, plastic on surface 94 is flowed across the grooves to seal the elements in.

FIG. 3 shows ADS 22 in place with a contact surface 48 bearing against a pad 108. Good electrical contact is achieved by cover 12 pushing ADS 22 down against the contact surface. Upper limb 56 has been deflected downwardly so it is pushing up against the contact surface.

Figure 4:
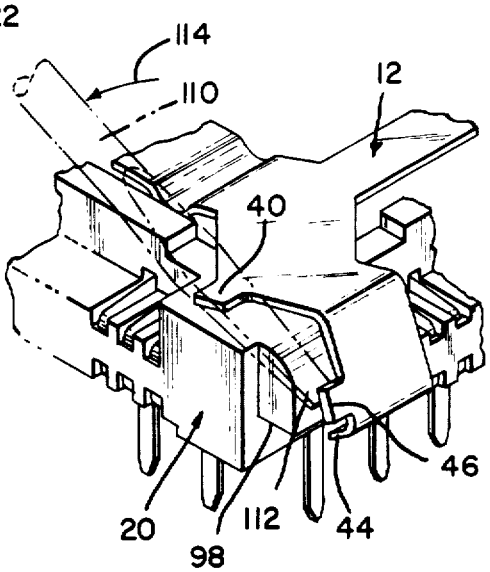
FIG. 4 illustrates one method for removing the cover.

FIG. 4 shows one method of removing cover 12. A screwdriver tip 110, shown in phantom, is used as a pry bar. It's free end 112 is placed behind second tab 46 and, using first tab 40 as a fulcrum, the screwdriver is rotated in the direction of arrow 114. This brings lip 44 out from below downwardly facing shoulder 98 on housing 20. Upon repeating the procedure on an adjacent corner; i.e., one with the same orientation, the cover may be removed by sliding it off in a direction away from the freed side.

The present invention may be subject to many modifications and changes without departing from the spirit or essential characteristics thereof. The present embodiment is therefore to be considered in all respects as illustrative and not restrictive of the scope of the invention.

What is claimed is:

1. A connector mountable on a printed circuit board for holding and electrically connecting an active device substrate to conductive traces on the board, the connector comprising:

a. a housing of insulating material formed in a square frame configuration and having corner blocks, side walls extending between and connected to the corner blocks and a floor, said blocks, side walls and floor defining an upwardly open, substrate-receiving compartment, the side walls having a step on the lower, outer surface providing an upwardly facing ledge, spaced openings extending through the side walls and into the central compartment and grooves extending across the ledge normal to the side walls, each groove connecting with an opening and latching means on each of the corner blocks.

b. first and second contact elements stamped and formed from a conductive material and having a C-shaped section with a contact surface at the free end of the upper limb and a depending pin at the free end of the lower limb, the lower limbs on the first elements being longer than such limbs on the second elements and further, being bent horizontally so that the pin depending therefrom is displayed horizontally with respect to the upper limb, said elements being positioned in the housing with the upper limbs positioned in the grooves on the steps of the side walls and extending through the openings so that the contact surfaces are positioned around the periphery of the central compartment and adapted to electrically engage an active device substrate which may be placed therein, and the lower limbs extend underneath the housing with the pins depending therefrom for insertion into a printed circuit board, the first and second elements being loaded in the housing in alternating fashion so that the pin on each first element is in line with the pin on an adjacent second element; and c. a cover for placement over the housing and having latching means for engaging the latching means on the corner blocks so that an active device substrate which may be placed in the central compartment will be retained therein.

2. A connector mounted on a printed circuit board holding and electrically connecting an active device substrate to conductive traces on the board, the connector comprising:

a. a housing made from an insulating material and having side walls enclosing an upwardly open compartment adapted for receiving an active device substrate, said side walls having openings extending therethrough and into the compartment, further the housing having a corner block at each corner, each block having latching means on one vertical surface thereof consisting of a downwardly facing shoulder, said latching means being on opposite sides of the housing:

b. contact elements of conductive material having a C-shaped section with the upper limb extending into the compartment through the openings in the side walls for abutting, electrical engagement with an active device substrate which may be in the compartment, with a lower limb extending below the housing and having a pin depending from the free end for insertion into the printed circuit board for electrical engagement with traces thereon; and c. a cover of generally square configuration and having an arm extending obliquely outwardly from each corner with each arm having a latch on the free end thereof, said latch including a depending member and an inwardly projecting lip adjacent the free end thereof, said cover being attached to the housing by forcing the lips on each latch in under the downwardly facing shoulders on the corner blocks.

3. The combination of claim 2 further including outwardly projecting tabs on each arm and on each depending member, said tabs on the depending member providing a catch for a pry-type tool tip and the tabs on the arms providing a fulcrum point so that upon pivoting the tool, the inwardly projecting lip may be withdrawn from the shoulder.

4. A cover for pressing and retaining an active device substrate, or the like, into engagement with contact elements in an insulating housing having a downwardly facing shoulder at each corner, said cover comprising:

a. a frame of four sides defining a central opening, b. arms extending obliquely outwardly from each corner of the frame, c. a latch attached to each arm and having a depending member with an inwardly projecting lip at the free end thereof so that the cover may be attached to the housing by forcing the lip on each latch in and under the downwardly facing shoulders on the housing corners; and d. outwardly projecting tabs on each arm and on each depending member, said tabs on the depending member providing a catch for a pry-type tool tip and the tabs on the arms providing a fulcrum point so that upon pivoting the tool, the inwardly projecting lip may be withdrawn from the shoulder.

*5. A cover for pressing and retaining an active device substrate, or the like, into engagement with contact elements in an insulating housing having a downwardly facing shoulder at each of two adjacent corners, said cover comprising:*

*a frame;*

*arms extending outwardly from each of two adjacent corners of the frame,*

*a latch attached to each arm and having a depending member with an inwardly projecting lip at the free end thereof so that the cover may be attached to the housing by forcing the lip on each latch in and under the downwardly facing shoulders on the housing corners; and*

*outwardly projecting tabs on each arm and on each depending member, said tabs on the depending member providing a catch for a pry-type tool tip and the tabs on the arms providing a fulcrum point so that upon pivoting the tool, the inwardly projecting lip may be withdrawn from the shoulder.*

*6. A connector for being mounted on a printed circuit board and for electrically connecting conductive areas on an active device substrate to conductive areas on said circuit board, said connector comprising:*

*dielectric housing means having side walls enclosing an upwardly open compartment adapted for removably receiving an active device substrate and downwardly facing shoulders on at least two adjacent corners of said sidewalls,*

*conductive contact means disposed in said housing means and having upper limb means for electrically engaging said conductive areas on said active device substrate received in said compartment and lower limb means depending from said housing means for electrically engaging said conductive areas on said circuit board; and*

*a cover for being attached to said housing means for retaining said active device substrate in said compartment, said cover having at least two outwardly extending arms, said arms having latch means at the free ends thereof with said latch means including a depending member with an inwardly projecting lip at the free end thereof for being removably received in under said downwardly facing shoulders on said housing means, and further having outwardly projecting fulcrum means on each arm and outwardly projecting tabs on each depending member with said fulcrum means on said arms providing a fulcrum point for a pry-type tool and said tabs providing a catch for a tip on said tool so that upon pivoting said tool about said fulcrum means, said inwardly projecting lip may be withdrawn from said downwardly facing shoulders.*

* * * * *